(12) United States Patent
Naito

(10) Patent No.: US 9,368,613 B2
(45) Date of Patent: Jun. 14, 2016

(54) SEMICONDUCTOR DEVICE AND METHOD FOR MANUFACTURING SEMICONDUCTOR DEVICE

(71) Applicant: FUJI ELECTRIC CO., LTD., Kawasaki-shi (JP)

(72) Inventor: Tatsuya Naito, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/531,326

(22) Filed: Nov. 3, 2014

(65) Prior Publication Data

US 2015/0048450 A1 Feb. 19, 2015

Related U.S. Application Data

(63) Continuation of application No. PCT/JP2013/080301, filed on Nov. 8, 2013.

(30) Foreign Application Priority Data

Nov. 8, 2012 (JP) .................................. 2012-246017
Oct. 11, 2013 (JP) .................................. 2013-213270

(51) Int. Cl.
*H01L 21/20* (2006.01)
*H01L 21/425* (2006.01)
(Continued)

(52) U.S. Cl.
CPC ...... *H01L 29/7808* (2013.01); *H01L 21/02532* (2013.01); *H01L 21/02595* (2013.01);
(Continued)

(58) Field of Classification Search
CPC ................ H01L 21/00; H01L 21/2255; H01L 21/02532; H01L 21/0254; H01L 21/32155; H01L 21/26513; H01L 21/265; H01L 21/26506; H01L 21/324; H01L 29/04

USPC .......... 438/479, 491, 514, 517, 527, 530, 546
See application file for complete search history.

(56) References Cited

U.S. PATENT DOCUMENTS 8,552,537 B2 * 10/2013 Shimizu ................. B82Y 10/00
257/632
2011/0310645 A1 12/2011 Godo
2012/0049187 A1 3/2012 Haruyama et al.

FOREIGN PATENT DOCUMENTS

CN 102412248 A 4/2012
EP 0680089 A1 11/1995
(Continued)

OTHER PUBLICATIONS

Notification of Reasons for Refusal issued in corresponding Japanese Patent Application No. 2014545776, dated Mar. 24, 2015. English translation provided.

(Continued)

*Primary Examiner* — Hsien Ming Lee
(74) *Attorney, Agent, or Firm* — Rossi, Kimms & McDowell LLP

(57) ABSTRACT

A protective diode has a basic structure including an $n^+$ layer, an $n^-$ layer, a $p^+$ layer, and an $n^-$ layer in this order. A p-type layer forming the protective diode is the $p^+$ layer with high impurity concentration. Therefore, the spreading of a depletion layer is suppressed and it is possible to reduce the area of the protective diode. In addition, phosphorus ions with a large diffusion coefficient are implanted to form the $n^-$ layer with low impurity concentration in the polysilicon layer forming the protective diode. A heat treatment is performed at a temperature of 1000° C. or higher to diffuse the phosphorus ions implanted into the polysilicon layer. Therefore, the impurity profile of the $n^-$ layer in the depth direction can be uniformized in the depth direction.

5 Claims, 9 Drawing Sheets

(51) Int. Cl.
*H01L 21/22* (2006.01)
*H01L 29/78* (2006.01)
*H01L 29/40* (2006.01)
*H01L 29/66* (2006.01)
*H01L 29/739* (2006.01)
*H01L 29/06* (2006.01)
*H01L 21/02* (2006.01)
*H01L 21/265* (2006.01)
*H01L 29/866* (2006.01)
*H01L 29/861* (2006.01)

(52) U.S. Cl.
CPC ...... *H01L21/26513* (2013.01); *H01L 29/0619* (2013.01); *H01L 29/402* (2013.01); *H01L 29/66712* (2013.01); *H01L 29/7395* (2013.01); *H01L 29/7811* (2013.01); *H01L 29/0692* (2013.01); *H01L 29/0696* (2013.01); *H01L 29/66106* (2013.01); *H01L 29/66121* (2013.01); *H01L 29/861* (2013.01); *H01L 29/866* (2013.01)

(56) References Cited

FOREIGN PATENT DOCUMENTS

| | | |
|---|---|---|
| JP | 62098674 A | 5/1987 |
| JP | 08088354 A | 4/1996 |
| JP | 09018001 A | 1/1997 |
| JP | 945905 A | 2/1997 |
| JP | 09186315 A | 7/1997 |
| JP | 10065157 A | 3/1998 |
| JP | 2002043574 A | 2/2002 |
| JP | 2006093505 A | 4/2006 |
| JP | 2012005009 A | 1/2012 |

OTHER PUBLICATIONS

International Search Report Issued in PCT/JP2013/080301 mailed Jan. 28, 2014. English translation provided.
Extended European Search Report issued in EP13852697.5, mailed Oct. 30, 2015.

* cited by examiner

US 9,368,613 B2

SEMICONDUCTOR DEVICE AND METHOD FOR MANUFACTURING SEMICONDUCTOR DEVICE

CROSS-REFERENCE TO RELATED APPLICATIONS

This application is a continuation of International Application No. PCT/JP2013/080301, filed on Nov. 8, 2013, and is based on and claims priority to Japanese Patent Application No. 2012-246017, filed on Nov. 8, 2012 and Japanese Patent Application No. 2013-213270, filed on Oct. 11, 2013. The disclosure of the Japanese priority applications and the PCT application in their entirety, including the drawings, claims, and the specification thereof, are incorporated herein by reference.

BACKGROUND

1. Field of the Invention

Embodiments of the present invention relate to a semiconductor device and a method for manufacturing a semiconductor device.

2. Discussion of the Background

An internal-combustion engine ignition device has been known which generates a high voltage from a low voltage and ignites a fuel-air mixture at a predetermined timing. FIG. 5 is a circuit diagram illustrating the structure of an internal-combustion engine ignition device 700. The structure and operation of the internal-combustion engine ignition device 700 will be described with reference to FIG. 5. The internal-combustion engine ignition device 700 includes an engine control unit (ECU) 51, an ignition IC 52, an ignition coil 56, an ignition plug 60, and a voltage source 59. The ignition IC 52 includes a protective diode 53, an insulated gate bipolar transistor (IGBT) 54, and resistors 55 and 61. The ignition coil 56 includes a primary coil 57 and a secondary coil 58.

The voltage source 59 supplies a constant voltage (for example, about 14 V) and is connected to one terminal of the primary coil 57 in the ignition coil 56. The other terminal of the primary coil 57 is connected to a C terminal of the ignition IC 52 (a collector electrode of the IGBT 54). An E terminal of the ignition IC 52 (an emitter electrode of the IGBT 54) is connected to the ground, and a G terminal of the ignition IC 52 (a gate electrode of the IGBT 54) is connected to the ECU 51. The ECU 51 has a function of transmitting a signal which controls the turn-on (short circuit) and turn-off (open) of the IGBT 54 forming the ignition IC 52 to the G terminal of the ignition IC 52. For example, a voltage of 5 V is applied to the G terminal of the ignition IC 52 to short-circuit the IGBT 54 of the ignition IC 52. In contrast, a voltage of 0 V is applied to the G terminal of the ignition IC 52 to open the IGBT 54 of the ignition IC 52.

Specifically, when an on-signal output from the ECU 51 is input to the G terminal of the ignition IC 52, the IGBT 54 of the ignition IC 52 is short-circuited and a collector current Ic starts to flow from the voltage source 59 to the C terminal of the ignition IC 52 through the primary coil 57 of the ignition coil 56. In contrast, when an off-signal output from the ECU 51 is input to the G terminal of the ignition IC 52, the IGBT 54 of the ignition IC 52 is opened and the collector current Ic is rapidly reduced. The rapid change in the collector current Ic causes a rapid increase in the voltage between both ends of the primary coil 57. Similarly, the voltage between both ends of the secondary coil 58 increases to tens of kilovolts (for example, 30 kV) and is applied to the ignition plug 60. The ignition plug 60 discharges when the applied voltage reaches a desired value.

Next, the protective diode 53 forming the ignition IC 52 will be described. When a surge voltage of hundreds of volts (for example, 400 V) is applied to the C terminal of the ignition IC 52, an initial surge current flows from the C terminal of the ignition IC 52 to the gate of the IGBT 54 through the protective diode 53 (zener diode). The IGBT 54 is short-circuited by the initial surge current and a collector current Ic following the initial surge current is generated. Since the collector current Ic following the initial surge current makes charge in the C terminal of the ignition IC 52 (the collector electrode of the IGBT 54) flow to the ground, the potential of the C terminal of the ignition IC 52 is reduced to the potential of the voltage source 59. That is, the protective diode 53 operates as a protective device which protects the IGBT 54 from overvoltage.

In FIG. 5, when the on-signal output from the ECU 51 is input to the G terminal of the ignition IC 52, the gate potential of the IGBT 54 is increased by the resistor 61 and the IGBT 54 is short-circuited. When the IGBT 54 is short-circuited, a primary current flows from the voltage source 59 to the primary coil 57. In contrast, when the off-signal output from the ECU 51 is input to the G terminal of the ignition IC 52, the IGBT 54 is opened and the potential of the C terminal of the ignition IC 52 increases. The voltage of the primary coil 57 also increases. When the flow of the primary current to the primary coil 57 is cut off, a high voltage is generated from the secondary coil 58 according to the turn ratio of the secondary coil 58 and the primary coil 57 and discharge occurs in the gap of the ignition plug 60 (the gap between the electrodes). A spark is generated by the discharge and the fuel-air mixture in a fuel chamber is ignited.

The protective diode 53 is connected between the collector and gate of the IGBT 54. When a high voltage is generated from the collector of the IGBT 54 at the time the flow of the primary current to the primary coil 57 is cut off, the gate potential of the IGBT 54 is increased by a current which flows at the clamping voltage of the protective diode 53 and the resistor 61. Therefore, it is possible to short-circuit the IGBT 54 and absorb a large amount of energy stored in the ignition coil 56. In addition, when a high voltage is applied to the collector of the IGBT 54, the protective diode 53 protects the IGBT 54 such that the IGBT 54 is not broken down.

Next, the IGBT 54 provided with the protective diode 53 will be described. There is a concern that a surge voltage will be applied to a semiconductor device, such as the IGBT 54 which is a power semiconductor element provided in the internal-combustion engine ignition device 700 illustrated in FIG. 5, due to some causes. For example, there are a surge voltage which is applied from the outside, a noise voltage, and a surge voltage that is generated by the operation of the IGBT 54 which is a power semiconductor element. Therefore, the protective diode 53 is provided between the collector and gate of the IGBT 54 and an overvoltage is clamped by the protective diode 53 so as not to be applied to the IGBT 54. In this way, the breakdown voltage of the semiconductor device (ignition IC 52) increases.

Next, the cross-sectional structure of a semiconductor device which will be the ignition IC 52 will be described with reference to FIGS. 6A and 6B. FIG. 6A is a plan view illustrating a main portion of the semiconductor device 600 according to the related art, and FIG. 6B is a cross-sectional view illustrating the main portion of the semiconductor device 600 according to the related art. As illustrated in FIGS. 6A and 6B, a pn junction between a $p^+$ layer 72 with high impurity concentration and an n⁻ layer 70 with low impurity concentration is formed on a LOCOS oxide film 5 in an edge termination region 104 of an IGBT 102 (corresponding to the IGBT 54 illustrated in FIG. 5). The p⁺ layer 72 and the n⁻ layer 70 are made of polysilicon. A plurality of p⁺ layers 72 and a plurality of n⁻ layers 70 are alternately and repeatedly arranged and are connected in series to each other.

Both ends of a polysilicon layer forming a protective diode 105 are n⁺ layers 71 with high impurity concentration. The n⁺ layer 71 comes into contact with the n⁻ layer 70 which is provided at the outermost end of the polysilicon layer. The p⁺ layers 72, the n⁻ layers 70 and the n⁺ layers 71 form the protective diode 105 (corresponding to the protective diode 53 illustrated in FIG. 5). The protective diode 105 is connected between the collector and gate of the IGBT 102. The n⁺ layers 71 provided at both ends of the polysilicon layer forming the protective diode 105 are connected to the collector and the gate of the IGBT 102.

The n⁻ layer 70 with low impurity concentration which forms the protective diode 105 is formed with a width (a width in a direction in which the layers forming the protective diode 105 are arranged in a line; hereinafter, simply referred to as a width) of 2.5 μm by the implantation of arsenic (As) ions into the polysilicon layer formed on the LOCOS oxide film 5 with a dose of, for example, $6 \times 10^{13}$ cm⁻². Then, a heat treatment is performed on each layer forming the protective diode 105 at the temperature (1000° C. or lower) of a reflow furnace when a boro-phospho silicate glass (BPSG: silicon glass including boron (B) and phosphorus (P)) film 14 is formed on the protective diode 105. When the n⁻ layer 70 is formed with a small width of 2.5 μm, it is possible to reduce operation resistance. Therefore, the following effect is obtained: the effect (clamping effect) of suppressing an increase in the breakdown voltage in a reverse bias application test which simulatively applies a reverse bias in order to verify the state of a semiconductor device when the reverse bias is applied. The reverse bias application test is a simple type of a voltage clamping test in which the voltage applied to the IGBT 102 is repeatedly clamped by the protective diode 105.

In addition, the following technique has been proposed: a protective diode between the gate and source or between the gate and drain of a metal oxide semiconductor field effect transistor (MOSFET: insulated gate field effect transistor) or a protective diode between the gate and emitter or between the gate and collector of an IGBT has a basic structure in which a pn junction between a p layer and an n layer is repeated (for example, see Japanese Patent Documents JP 9-186315 A, JP 8-88354 A, and JP 9-18001 A).

Furthermore, a protective diode with an n⁺/n⁻/p–/n⁻/n⁺/n⁻/p–/n⁻/n⁺ structure which is inserted between the gate and source of a power MOSFET has been proposed (for example, see Japanese Patent Document JP 2002-43574 A). In JP 2002-43574 A, the protective diode is connected between the gate and source of the MOSFET and is not connected between the drain and gate of the MOSFET. The protective diode having this structure holds a surge voltage applied between the gate and source of the MOSFET with a p–/n⁻/n⁺ junction. In addition, in JP 2002-43574 A, a p⁻ layer with low impurity concentration is formed on one surface of a gate oxide film and an n⁻ layer with low impurity concentration and an n⁺ layer with high impurity concentration which pass through the p⁻ layer in a depth direction are selectively formed in the p⁻ layer.

However, as described above, the protective diode 105 according to the related art illustrated in FIGS. 6A and 6B has the effect (clamping effect) of suppressing an increase in the breakdown voltage in the reverse bias application test which simulates the application of a surge voltage. However, when the clamping voltage is frequently applied, the pn junction between the p⁺ layer 72 and the n⁻ layer 70 deteriorates locally. Therefore, a leakage current increases and a breakdown voltage failure occurs. This problem will be described in detail with reference to FIGS. 7 and 8.

FIG. 7 is a cross-sectional view illustrating a main portion of the protective diode 105 of the semiconductor device 600 according to the related art illustrated in FIGS. 6A and 6B. FIG. 8 is a characteristic diagram illustrating the relationship (diffusion concentration distribution) between the diffusion depth and impurity concentration of arsenic (As) in the n⁻ layer 70 forming the protective diode 105 illustrated in FIGS. 6A and 6B. When the dopant of the n⁻ layer 70 is arsenic (As), the impurity concentration of the n⁻ layer 70 in the depth direction (on the side closer to the LOCOS oxide film 5 than to the BPSG film 14) is low since arsenic has a small diffusion coefficient, as illustrated in FIG. 8. When the p⁺ layer 72 which has a higher impurity concentration than the n⁻ layer 70 is formed in the n⁻ layer 70 having this impurity profile, the width of the n⁻ layer 70 is reduced from the surface (the interface between the BPSG film 14 and the protective diode 105) in the depth direction (a direction from the BPSG film 14 to the LOCOS oxide film 5). Therefore, a pn junction surface 89 between the p⁺ layer 72 and the n⁻ layer 70 is not flat (substantially perpendicular to the main surface of the substrate). When the clamping voltage is frequently applied to the protective diode 105, the electric field is concentrated on the portion (pn junction surface 89) and the leakage current increases, which results in a breakdown voltage failure.

In JP 2002-43574 A, when the protective diode with a breakdown voltage of tens of volts which is inserted between the gate and source of the MOSFET is inserted between the collector and gate of the IGBT, a high breakdown voltage of about 1000 V or more may be required. As a result, the area of each layer forming the protective diode increases (the width of each layer increases) and the overall area of the protective diode increases.

As disclosed in JP 2002-43574 A, when the protective diode has the n⁺/n⁻/p–/n⁻/n⁺/n⁻/p–/n⁻/n⁺ structure, the spreading of a depletion layer to the n⁻ layer is stopped by the n⁺ layer which is adjacent to the n⁻ layer. Therefore, it is possible to reduce the width of the n⁻ layer. In contrast, since a stopper layer for stopping the spreading of the depletion layer to the p⁻ layer is not provided, it may be necessary to increase the width of the p⁻ layer and the area of the protective diode increases. In particular, when the protective diode is connected between the drain and gate of the MOSFET or between the collector and gate of the IGBT, it should have a high breakdown voltage and a large number of p⁻ layers with a large width should be included. As a result, the area of the protective diode increases.

SUMMARY

Embodiments of the invention provide a semiconductor device which includes a protective diode, can reduce the area of the protective diode, and can reduce the concentration of the electric field on a pn junction between a p layer and an n layer forming the protective diode and a method for manufacturing the semiconductor device.

A semiconductor device according to an aspect of the invention has the following characteristics. An insulating film is provided on a semiconductor substrate. A protective element that is made of a polysilicon layer and clamps a surge voltage is provided on the insulating film. The protective element has a unit structure including a first semiconductor layer of a first conductivity type, a second semiconductor layer of the first conductivity type, a third semiconductor layer of a second conductivity type, and a fourth semiconductor layer of the first conductivity type, or two or more unit structures that are connected in series to each other. The second semiconductor layer comes into contact with one end of the first semiconductor layer and has a lower impurity concentration than the first semiconductor layer. The third semiconductor layer comes into contact with the other end of the second semiconductor layer and has a higher impurity concentration than the second semiconductor layer. The fourth semiconductor comes into contact with one end of the third semiconductor layer and has an impurity concentration that is lower than the impurity concentration of the third semiconductor layer and is substantially equal to the impurity concentration of the second semiconductor layer. One end of the protective element is the first semiconductor layer. The other end of the protective element is a fifth semiconductor layer of the first conductivity type which has an impurity concentration that is substantially equal to the impurity concentration of the first semiconductor layer.

In the semiconductor device according to the above-mentioned aspect of the invention, a pn junction surface between the second semiconductor layer and the third semiconductor layer may be substantially perpendicular to a main surface of the semiconductor substrate.

In the semiconductor device according to the above-mentioned aspect of the invention, a pn junction surface between the third semiconductor layer and the fourth semiconductor layer may be substantially perpendicular to a main surface of the semiconductor substrate.

In the semiconductor device according to the above-mentioned aspect of the invention, high-resistance layers which have a greater resistance value than the second semiconductor layer or the fourth semiconductor layer may be provided at both ends of the protective element in a direction perpendicular to a direction in which the first semiconductor layer, the second semiconductor layer, the third semiconductor layer, and the fourth semiconductor layer forming the unit structure are arranged in a line.

In the semiconductor device according to the above-mentioned aspect of the invention, the resistance value of the high-resistance layer may be equal to or greater than 1 MΩ.

In the semiconductor device according to the above-mentioned aspect of the invention, the resistivity of the high-resistance layer may be equal to or greater than 10 Ωcm.

The semiconductor device according to the above-mentioned aspect of the invention may further include an insulated gate switching element that is provided in the semiconductor substrate. One end of the protective element may be connected to a gate of the insulated gate switching element and the other end of the protective element may be connected to a high-potential-side electrode of the insulated gate switching element.

The semiconductor device according to the above-mentioned aspect of the invention may further include an active portion of the insulated gate switching element in which a main current flows and an edge termination region of the insulated gate switching element that surrounds the active portion and holds a breakdown voltage. The edge termination region may be provided below the protective element.

In the semiconductor device according to the above-mentioned aspect of the invention, the protective element may be a bidirectional diode.

There is provided a method for manufacturing the semiconductor device according to another aspect of the invention. First, a first step of forming the polysilicon layer on the semiconductor substrate, with the insulating film interposed therebetween, is performed. Then, a second step of implanting phosphorus ions into the entire polysilicon layer and performing a heat treatment at a temperature of 1000° C. or higher to form a first-conductivity-type semiconductor layer which will be the second semiconductor layer and the fourth semiconductor layer is performed. Then, a third step of selectively implanting boron ions and the phosphorus ions into the first-conductivity-type semiconductor layer so as be separated from each other and performing the heat treatment to alternately form the third semiconductor layers and the first semiconductor layers, which reach the insulating film through the first-conductivity-type semiconductor layer in a depth direction and have a higher impurity concentration than the first-conductivity-type semiconductor layer, so as to be separated from each other is performed. The third step forms the third semiconductor layer and the first semiconductor layer such that an end of the polysilicon layer is the first semiconductor layer.

In the method for manufacturing the semiconductor device according to the above-mentioned aspect of the invention, the first-conductivity-type semiconductor layer may have a substantially constant impurity concentration in a thickness direction.

In the method for manufacturing the semiconductor device according to the above-mentioned aspect of the invention, the third step may include a step of implanting the boron ions, using a first mask formed on the first-conductivity-type semiconductor layer as a mask, to form the third semiconductor layer and a step of implanting the phosphorus ions, using a second mask formed on the first-conductivity-type semiconductor layer as a mask, to form the first semiconductor layer. The width of a portion of the first-conductivity-type semiconductor layer which is covered by both the first mask and the second mask may be equal to or greater than 1.2 μm and equal to or less than 1.8 μm.

In the method for manufacturing the semiconductor device according to the above-mentioned aspect of the invention, in the implantation of the phosphorus ions in the second step, the phosphorus ions may be implanted with a dose that is equal to or greater than $2 \times 10^{14}$ cm$^{-2}$ and equal to or less than $6 \times 10^{14}$ cm$^{-2}$.

According to the semiconductor device and the method for manufacturing the semiconductor device according to the invention, the spreading of a depletion layer in a protective diode is suppressed and it is possible to reduce the area of the protective diode. In addition, according to the semiconductor device and the method for manufacturing the semiconductor device according to the invention, a pn junction surface between a p$^+$ layer with high impurity concentration and an n$^-$ layer with low impurity concentration which form the protective diode is flattened (substantially perpendicular to a main surface of a substrate). Therefore, it is possible to suppress the concentration of the electric field on the pn junction surface.

DESCRIPTION OF ILLUSTRATED EMBODIMENTS

Figure 1A:
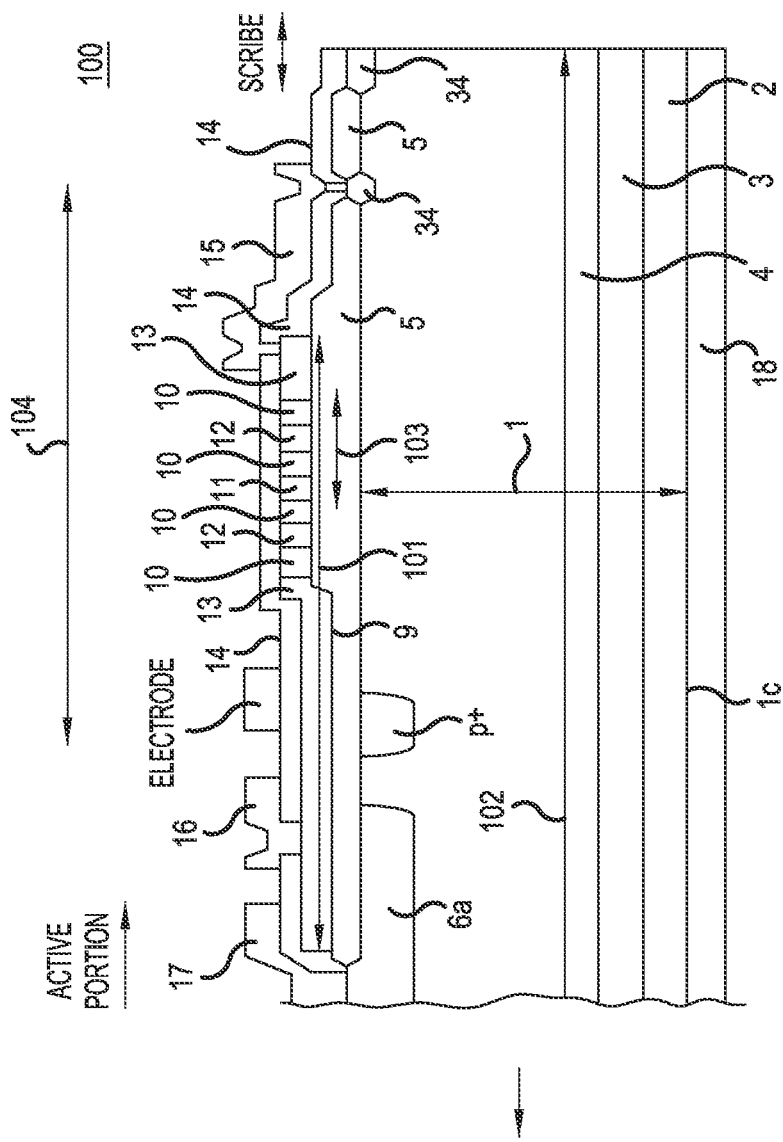
FIGS. 1A and 1B are cross-sectional views illustrating the structure of a semiconductor device 100 according to a first embodiment of the invention.

Hereinafter, a semiconductor device and a method for manufacturing a semiconductor device according to embodiments of the invention will be described in detail with reference to the accompanying drawings. In the specification and the accompanying drawings, in the layers or regions having "n" or "p" appended thereto, an electron or a hole means a majority carrier. In addition, symbols "+" and "−" added to n or p mean that impurity concentration is higher and lower than that of the layer without the symbols. In the description of the following embodiments and the accompanying drawings, the same components are denoted by the same reference numerals and the description thereof will not be repeated. In the following embodiments, a first conductivity type is an n type and a second conductivity type is a p type. However, in the invention, the first conductivity type may be a p type and the second conductivity type may be an n type. In this case, the same effect is obtained.

First Embodiment

Figure 1B:
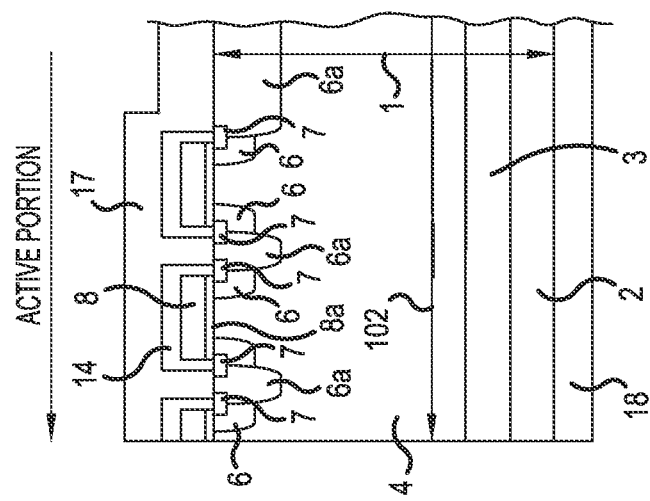
Figure 5:
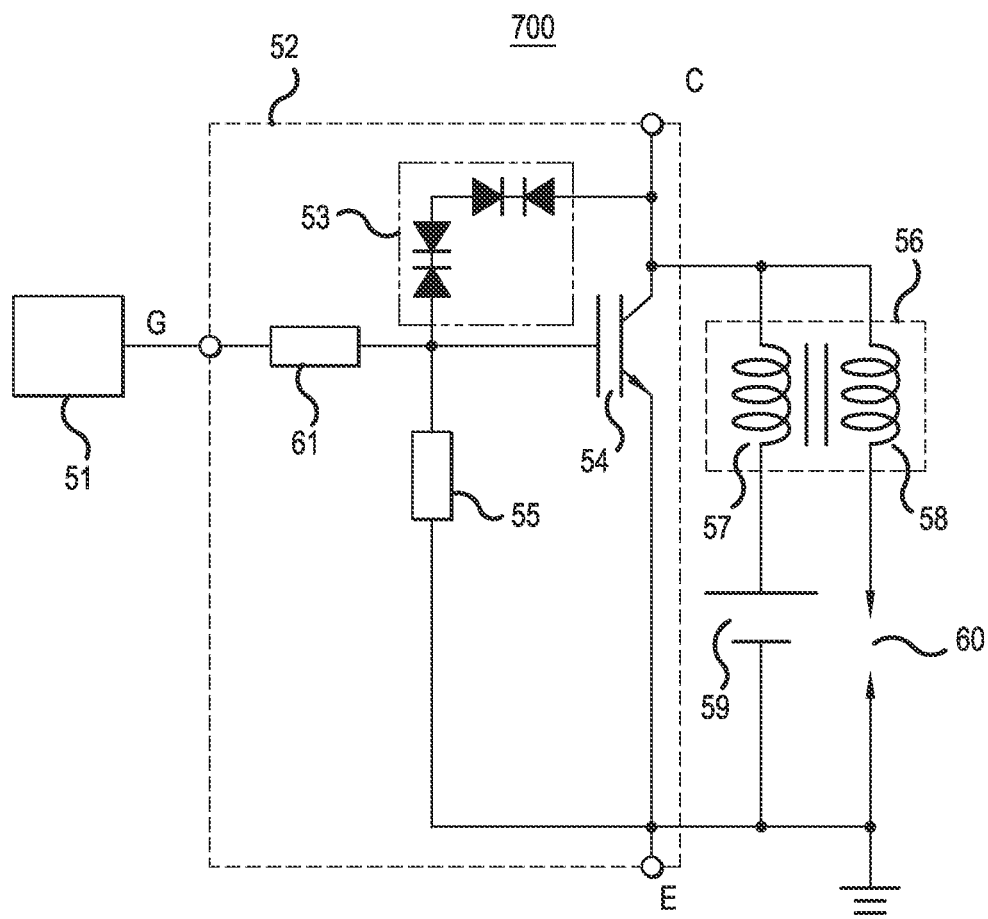
FIG. 5 is a circuit diagram illustrating the structure of an internal-combustion engine ignition device.

The structure of a semiconductor device forming an ignition IC of an internal-combustion engine ignition device will be described as an example of the structure of a semiconductor device according to a first embodiment of the invention. Since the circuit structure of the internal-combustion engine ignition device is the same as that of the internal-combustion engine ignition device 700 illustrated in FIG. 5, the description thereof will not be repeated. FIG. 1A is a cross-sectional view illustrating a main portion of the semiconductor device 100 in which a protective diode 101 is formed. FIG. 1B is a cross-sectional view illustrating a main portion in the vicinity of an active portion of the IGBT 102, which is connected to FIG. 1A. As illustrated in FIGS. 1A and 1B, the semiconductor device 100 according to the first embodiment has a structure in which an insulated gate bipolar transistor (IGBT) 102, which is a power semiconductor element, and the protective diode 101, which is a bidirectional zener diode, are formed on the same semiconductor substrate (epitaxial substrate 1). The epitaxial substrate 1 is formed by sequentially laminating an n buffer layer 3 and an n drift layer 4 on a front surface of a p-type semiconductor base which will be a p collector layer 2.

In the active portion of the IGBT 102, a MOS gate (metal-oxide-semiconductor insulated gate) including a p well layer 6, a high-concentration p⁺ well layer 6a, an n⁺ emitter layer 7, a gate oxide film 8a, and a gate electrode 8 is provided on the front surface side of the structure epitaxial substrate 1. An emitter electrode 17 is connected to the high-concentration p⁺ well layer 6a and the n⁺ emitter layer 7 and is electrically connected to the gate electrode 8 by a BPSG film 14. A collector electrode 18 is provided on a rear surface 1c of the epitaxial substrate 1 so as to come into contact with the p collector layer 2. An edge termination region 104 of the IGBT 102 is provided in an outer circumferential portion of the epitaxial substrate 1. The edge termination region 104 of the IGBT 102 surrounds the active portion of the IGBT 102. The active portion of the IGBT 102 is a region in which a current flows when the semiconductor is turned on. The edge termination region 104 of the IGBT 102 reduces the electric field on the front surface side of the epitaxial substrate 1 and holds a breakdown voltage.

In the edge termination region 104 of the IGBT 102, a LOCOS oxide film 5 is provided on the front surface of the epitaxial substrate 1 so as to extend from the edge termination region 104 to the active portion. The protective diode 101 which is made of a polysilicon layer 9 is formed on the LOCOS oxide film 5. The protective diode 101 has a basic structure 103 (n⁺/n⁻/p⁺/n⁻ structure) in which an n⁺ layer 11 with high impurity concentration, an n⁻ layer 10 with low impurity concentration, a p⁺ layer 12 with high impurity concentration, and the n⁻ layer 10 with low impurity concentration are connected in series to each other in this order. In addition, a plurality of (multi-stage) basic structures 103 are repeatedly arranged in series in a direction perpendicular to the direction in which the layers forming the basic structure 103 are arranged in a line. The number of stages of the basic structures 103 depends on the breakdown voltage of the IGBT 102 and increases as the breakdown voltage increases. The n⁺ layer 11 functions as a buffer layer which stops the spreading of the depletion layer from a pn junction between the p⁺ layer 12 and the n⁻ layer 10 (hereinafter, referred to as a pn junction of the p⁺ layer 12 and the n⁻ layer 10). The breakdown voltage of the protective diode 101 is set to be lower than the breakdown voltage of the IGBT 102. The p⁺ layer 12 has a sufficient impurity concentration or length (width) to stop the spreading of the depletion layer in the p⁺ layer 12 such that the depletion layer which is spread into the p⁺ layer 12 does not reach an adjacent n⁻ layer 10 over the p⁺ layer 12.

The inner circumferential end (active-portion-side end) and the outer circumferential end of the protective diode 101 become n⁺ contact layers 13 which will be the polysilicon layers 9. The n⁺ contact layer 13 comes into contact with the n⁻ layer 10 which is disposed closest to the end of the protective diode 101. The impurity concentration of the n⁺ contact layer 13 is substantially equal to that of the n⁺ layer 11. The n⁺ contact layer 13 also functions as the n⁺ layer 11 of the basic structure 103. The n⁺ contact layer 13 which is arranged on the inner circumferential side of the protective diode 101 extends to the active portion of the IGBT 102 on the LOCOS oxide film 5. In addition, the n⁺ contact layer 13 which is arranged on the inner circumferential side of the protective diode 101 is connected to (contacted with) a gate runner electrode 16 through an opening portion of the BPSG film 14 provided on the protective diode 101. The n⁺ contact layer 13 which is arranged on the outer circumferential side of the protective diode 101 is connected to a wiring line 15 through the opening portion of the BPSG film 14.

The gate runner electrode 16 is connected to the gate electrode 8 of the IGBT 102 in a portion (not illustrated). The wiring line 15 is connected to an n⁺ scribe layer 34 which is selectively formed in a surface layer of the front surface of the epitaxial substrate 1 so as to be exposed from the outer circumferential end of the epitaxial substrate 1, that is, a scribe surface (cut surface), or an n⁺ layer (hereinafter, the n⁺ layer is also referred to as the n⁺ scribe layer 34) which is formed on the inner circumferential side of the n⁺ scribe layer 34, with the LOCOS oxide film 5 interposed therebetween. The potential of the n⁺ scribe layer 34 is the potential of the collector electrode of the IGBT 102. That is, the protective diode 101 is connected between the collector and gate of the IGBT 102.

The protective diode 101, which is the polysilicon layer 9, has the structure in which a plurality of basic structures 103, each of which is made of the polysilicon layer 9, are repeatedly connected in series to each other. Both ends of the protective diode 101 which are connected to the gate runner electrode 16 and the wiring line 15 are the n⁺ contact layers 13 which are the polysilicon layers 9. In other words, the protective diode 101, which is the polysilicon layer 9, has a structure in which the n⁺ contact layer 13 is connected to one end of one basic structure 103, which is terminated by the n⁻ layer 10, of two basic structures 103 disposed at both ends of a row of the plurality of basic structures 103.

The basic structure 103 is a zener diode which has a bidirectional breakdown voltage and includes the n⁻ layer 10 that comes into contact with the p⁺ layer 12 and the n⁺ layer 11 which will be a buffer layer coming into contact with the n⁻ layer 10. A portion on which the electric field is concentrated is divided into a pn junction between the p⁺ layer 12 and the n⁻ layer 10 (a pn junction of p⁺ layer 12 and the n⁻ layer 10) and an nn⁺ junction between the n⁻ layer 10 and the n⁺ layer 11 (hereinafter, referred to as an nn⁺ junction of the n⁻ layer 10 and the n⁺ layer 11) by the basic structure 103. Therefore, the concentration of the electric field on the pn junction of the p⁺ layer 12 and the n⁻ layer 10 is significantly reduced. The breakdown voltage by the p⁺ layer 12, the n⁻ layer 10, and the n⁺ layer 11 of the basic structure 103 is typically, for example, about 6.5 V. In the protective diode 101 of the IGBT 102 with a breakdown voltage of about 400 V to 450 V, for example, the number of serial connections of the basic structures 103 is 62.

In addition, the basic structure 103 does not include a p⁻ layer with low impurity concentration, but includes the p⁺ layer 12 with high impurity concentration. Therefore, the spreading of the depletion layer in the p⁺ layer 12 is suppressed. As a result, it is possible to reduce the area of the protective diode 101.

Figure 2:
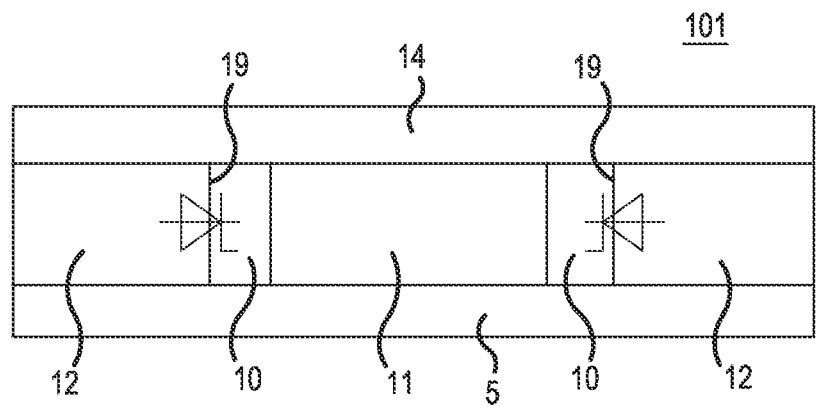
FIG. 2 is an enlarged cross-sectional view illustrating a portion of a protective diode 101 illustrated in FIGS. 1A and 1B.

FIG. 2 is an enlarged cross-sectional view illustrating a portion of the protective diode 101. For example, the n⁻ layer 10 with low impurity concentration which has a width (a width in the direction in which the layers forming the basic structure 103 are arranged in a line; hereinafter, simply referred to as a width) of about 1.2 µm to 1.8 µm is formed by the implantation of phosphorus (P) ions with a dose of $2\times10^{14}$ cm⁻² to $6\times10^{14}$ cm⁻² and a heat treatment which is performed at a high temperature of about 1000° C. or higher. As such, phosphorus (P) which has a lager diffusion coefficient than arsenic (As) is implanted into the polysilicon layer 9 to form the n⁻ layer 10 with low impurity concentration. Therefore, the impurity concentration of the n⁻ layer 10 in the depth direction (a direction from the interface between the polysilicon layer 9 and the BPSG film 14 to the inside of the epitaxial substrate 1) is flattened, as compared to when the n⁻ layer 10 is formed using arsenic (As) with a small diffusion coefficient as a dopant (the impurity concentration of the n⁻ layer in the depth direction is substantially constant). As a result, when boron (B) with high impurity-concentration is diffused into the n⁻ layer 10 having the flattened impurity concentration to form the p⁺ layer 12, a pn junction surface 19 between the p⁺ layer 12 and the n⁻ layer 10 is flat along the depth direction (which is substantially perpendicular to the front surface of the epitaxial substrate 1). Therefore, when a surge voltage is applied, the concentration of the electric field on the pn junction surface 19 between the p⁺ layer 12 and the n⁻ layer 10 is suppressed.

As such, since the protective diode 101 is connected between the collector and gate of the IGBT 102, it is possible to improve the reliability of the ignition IC 52 which is the semiconductor device 100.

Figure 3:
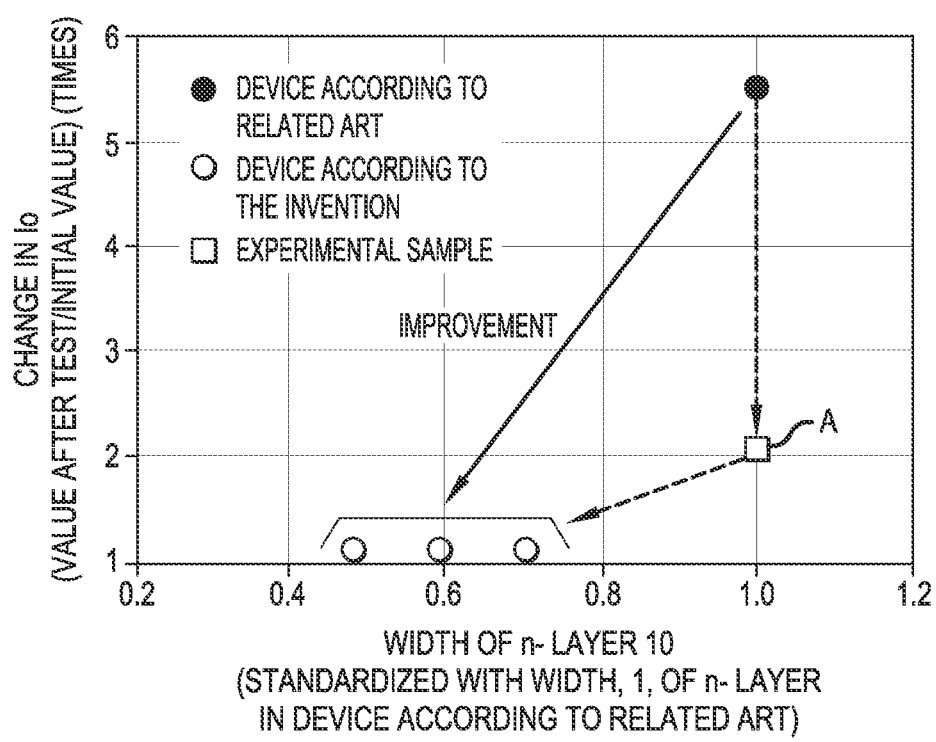
FIG. 3 is a characteristic diagram illustrating the relationship between a leakage current Io with respect to the width of an n⁻ layer 10 forming the protective diode 101 in a device according to an embodiment of the invention.
Figure 6A:
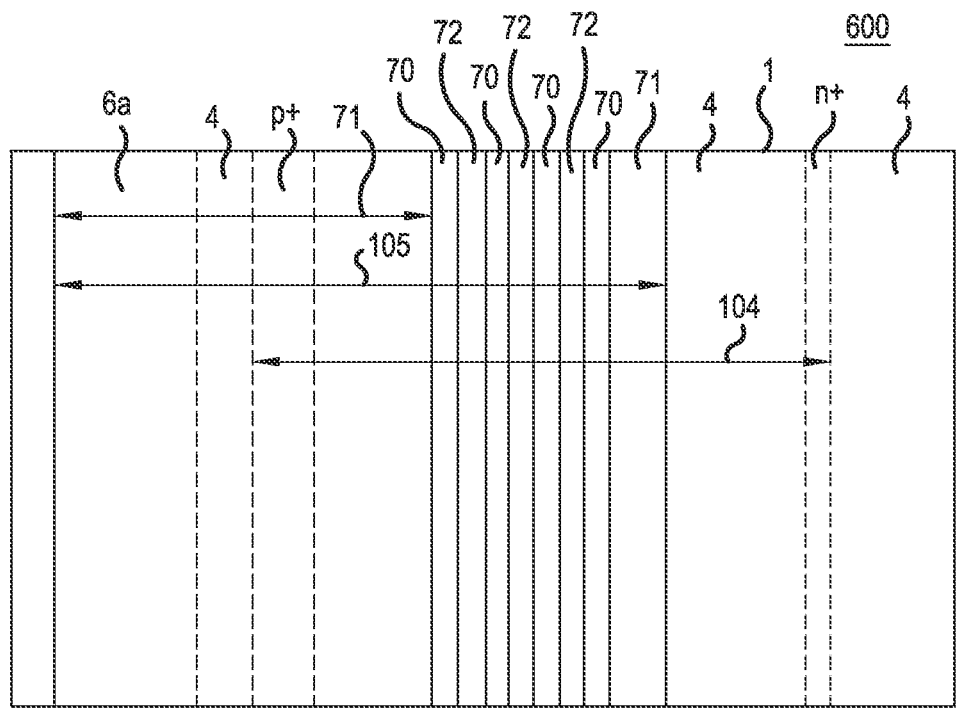
FIGS. 6A and 6B are plan and cross-sectional views illustrating the structure of a semiconductor device according to the related art.
Figure 6B:
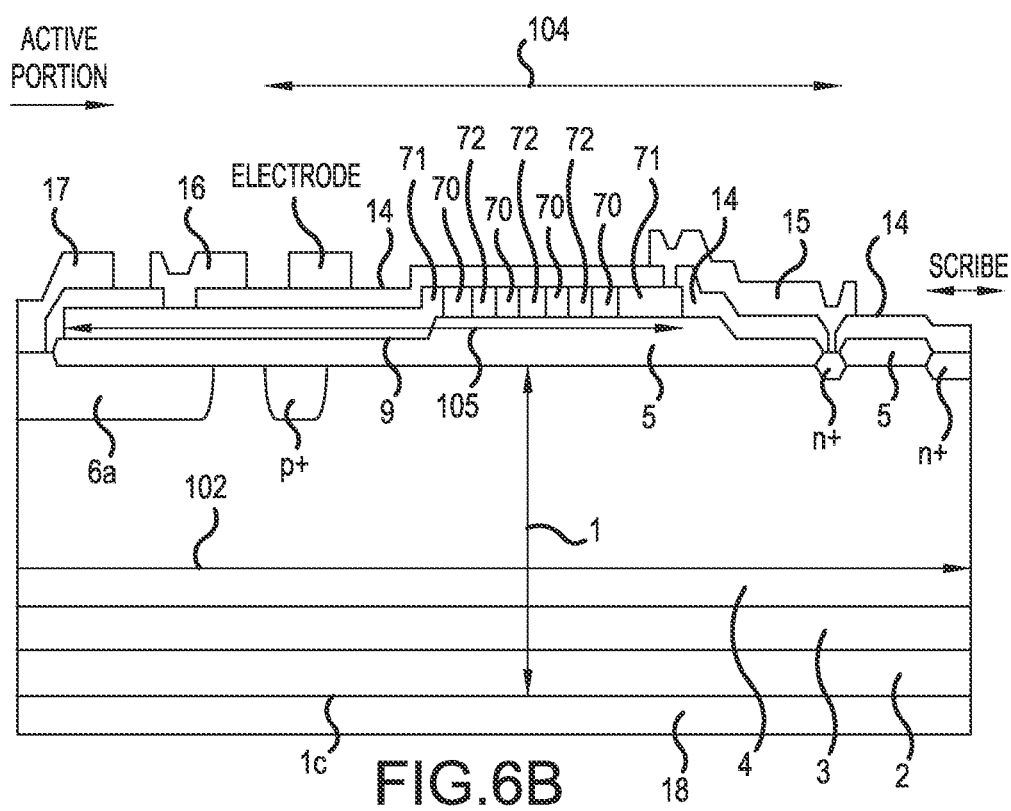
Figure 7:
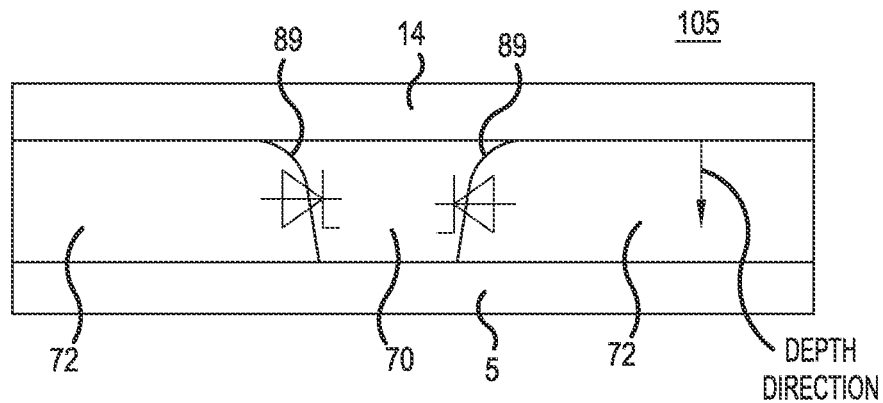
FIG. 7 is a cross-sectional view illustrating a main portion of a protective diode 105 of the semiconductor device according to the related art illustrated in FIGS. 6A and 6B.
Figure 8:
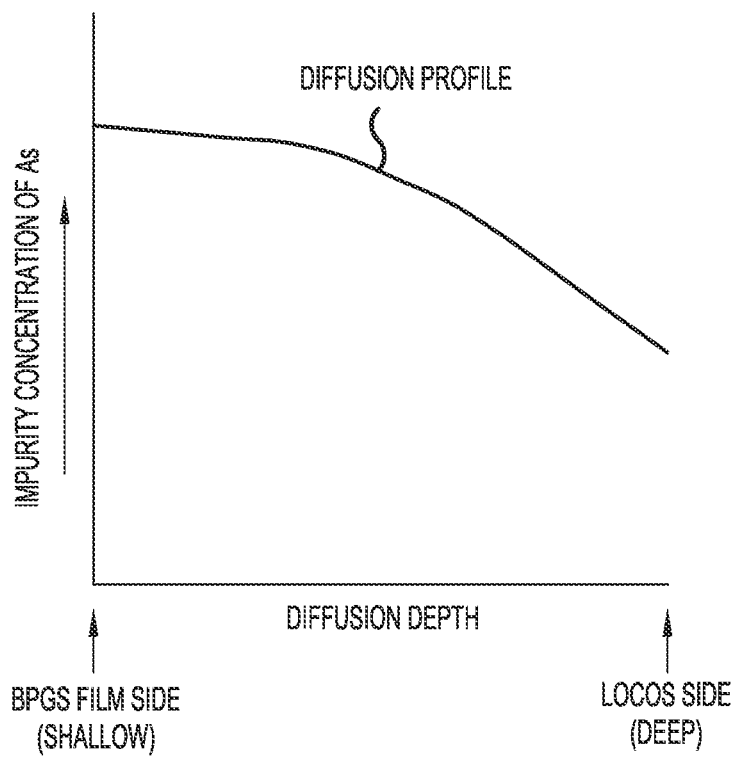
FIG. 8 is a characteristic diagram illustrating the relationship between the impurity concentration and diffusion depth of arsenic (As) in an n⁻ layer forming the protective diode illustrated in FIGS. 6A and 6B.

Next, the relationship between a leakage current Io and the width of the n⁻ layer 10 forming the protective diode 101 (a structure of n⁺/n⁻/p⁺/n⁻/n⁺/n⁻/ . . . ) of the semiconductor device 100 (hereinafter, referred to as a device according to an embodiment of the invention) illustrated in FIGS. 1A and 1B. FIG. 3 is a characteristic diagram illustrating the leakage current Io and the width of the n⁻ layer 10 forming the protective diode 101 of the device according to an embodiment of the invention. A simple reliability test was performed on the device according to an embodiment of the invention. FIG. 3 illustrates the result of the simple reliability test for the device according to an embodiment of the invention. In the simple reliability test (reverse bias application test), a DC voltage which was assumed as a clamping voltage was applied for a long time and a change in the leakage current Io of the protective diode 101 before and after the application of the DC voltage was measured. The application time of the DC voltage was the accumulated time of the clamping voltage applied during the lifetime of the semiconductor device 100. FIG. 3 also illustrates a device according to the related art for reference. The device according to the related art is the semiconductor device 600 illustrated in FIGS. 6A and 6B. That is, in the device according to the related art, the basic structure of the protective diode is a p⁺/n⁻ structure in which the p⁺ layer 72 with high impurity concentration and the n⁻ layer 70 with low impurity concentration are repeated.

In FIG. 3, letter A indicates an experimental sample. In the experimental sample, the width of an n⁻ layer 10 is the same as that in the device according to the related art and impurity ions which are implanted in order to form the n⁻ layer 10 are changed from arsenic (As) to phosphorus (P). In addition, similarly to the device according to an embodiment of the invention, an n⁺ layer 11 (buffer layer) is provided and a heat treatment temperature after the ion implantation increases to 1000° C. or higher. In the device according to an embodiment of the invention, the width of the n⁻ layer 10 in the experimental sample A is reduced to the range of 0.5 times to 0.7 times that in the device according to the related art. Specifically, in the device according to an embodiment of the invention, the width range of the n⁻ layer 10 is, for example, from about 1.2 µm to 1.8 µm. FIG. 3, the horizontal axis indicates a value obtained by standardizing the width of the n⁻ layer 10 in the device according to an embodiment of the invention with the width, 1, of the n⁻ layer 70 in the device according to the related art, that is, the ratio of the width of the n⁻ layer 10 in the device according to an embodiment of the invention to the width of the n⁻ layer 70 in the device according to the related art (=[the width of the n⁻ layer 10 in the device according to an embodiment of the invention]/[the width of the n⁻ layer 70 in the device according to the related art]). In FIG. 3, the vertical axis indicates the ratio of the leakage current lo after the test to the initial leakage current lo (before the test) (=[the leakage current lo after the test]/[the initial leakage current lo]; hereinafter, referred to as a change in the leakage current lo).

In the device according to an embodiment of the invention (semiconductor device 100), the portion on which the electric field is concentrated is divided into two portions, that is, the pn junction between the p⁺ layer 12 with high impurity concentration and the n⁻ layer 10 with low impurity concentration (the pn junction of the p⁺ layer 12 and the n⁻ layer 10) and the nn⁺ junction between the n⁻ layer 10 with low impurity concentration and the n⁺ layer 11 with high impurity concentration (the nn⁺ junction of the n⁻ layer 10 and the n⁺ layer 11) and the concentration of the electric field on the pn junction between the p⁺ layer 12 and the n⁻ layer 10 is significantly reduced. In addition, the result illustrated in FIG. 3 proved that, in the device according to an embodiment of the invention, since the pn junction surface 19 between the p⁺ layer 12 with high impurity concentration and the n⁻ layer 10 with low impurity concentration (the pn junction surface of the p⁺ layer 12 and the n⁻ layer 10) was flattened, a change in the leakage current lo was significantly reduced, as compared to the device according to the related art (while the rate of change of the leakage current lo in the device according to the related art was 5.5, the rate of change of the leakage current lo in the device according to an embodiment of the invention was 1.2 or less). This result proved that the device according to an embodiment of the invention could significantly improve reliability with respect to the clamping voltage.

In the semiconductor device 100, the collector electrode 18 of the IGBT 102 is a high-potential-side electrode of the IGBT 102 and the emitter electrode 17 of the IGBT 102 is a low-potential-side electrode of the IGBT 102. In the semiconductor device 100, the power semiconductor element forming the ignition IC is the IGBT 102 which is a MOS switching element. However, the power semiconductor element forming the ignition IC may be a MOSFET. In this case, the same effect as described above is obtained. In this case, a drain electrode of the MOSFET is a high-potential-side electrode of the MOSFET and a source electrode of the MOSFET is a low-potential-side electrode of the MOSFET.

As described above, according to the first embodiment, the protective diode which is connected between the collector and gate of the IGBT has the structure of n⁺/n⁻/p⁺/n⁻/n⁺/n⁻/... and the width of the n⁻ layer forming the protective diode is in the range of, for example, about 1.2 μm to 1.8 μm. Therefore, the spreading of the depletion layer in the protective diode is suppressed and it is possible to reduce the area of the protective diode. In addition, since the pn junction surface between the p⁺ layer and the n⁻ layer in the protective diode is flattened, it is possible to suppress the concentration of the electric field on the pn junction surface. Therefore, the device according to an embodiment of the invention can significantly improve reliability with respect to the clamping voltage and suppress the local deterioration of the pn junction between the p⁺ layer and the n⁻ layer. As a result, it is possible to reduce a leakage current and prevent the occurrence of a breakdown voltage failure.

Second Embodiment

Figure 4A:
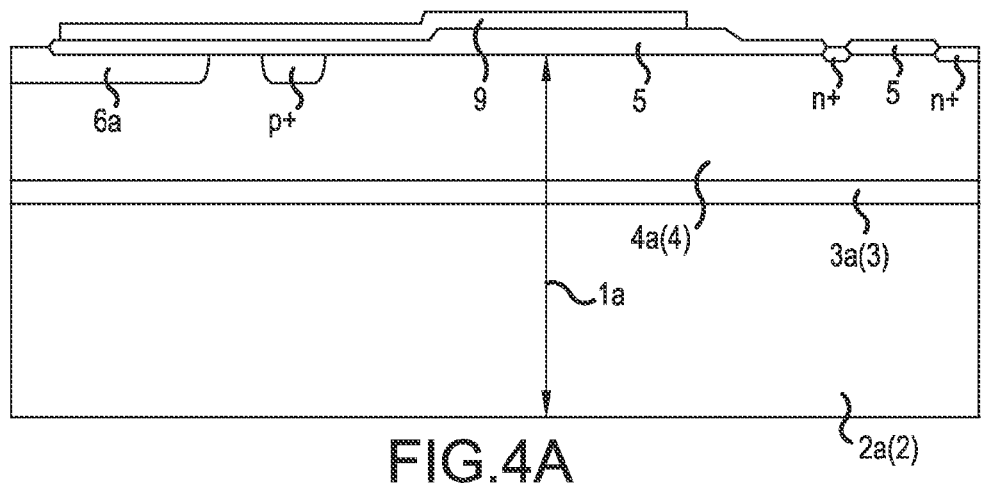
FIGS. 4A, 4B, and 4C are cross-sectional views illustrating the state of a semiconductor device during manufacturing according to a second embodiment of the invention.
Figure 4B:
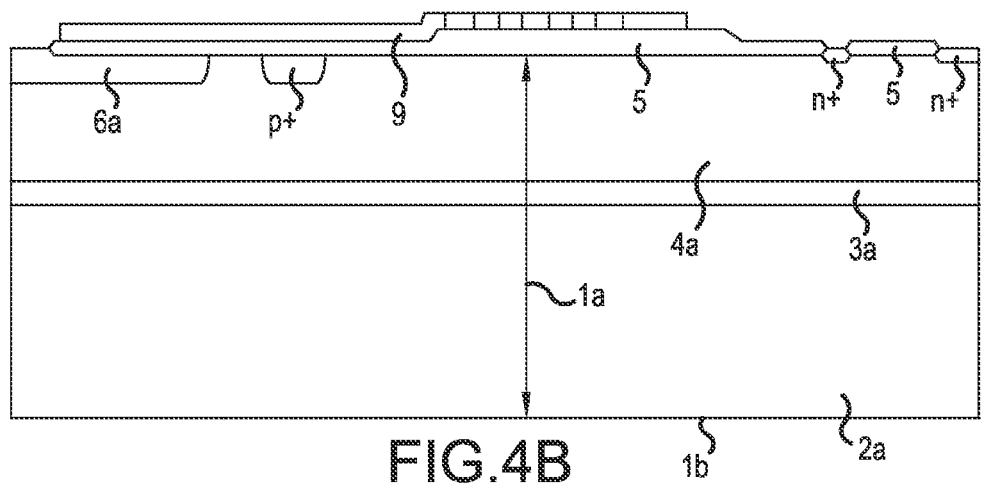
Figure 4C:
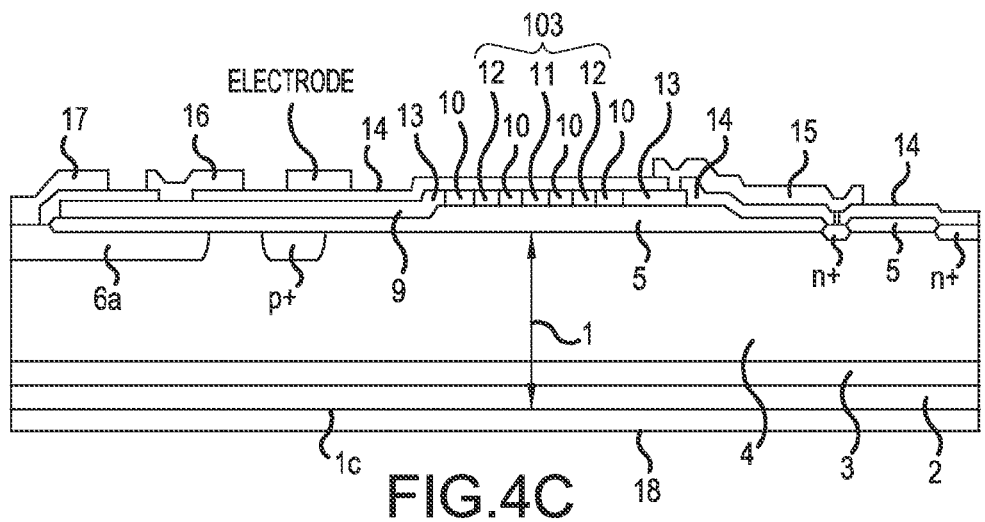

Next, a method for manufacturing the protective diode of the semiconductor device according to the first embodiment illustrated in FIGS. 1A and 1B will be described as an example of a method for manufacturing a semiconductor device according to a second embodiment of the invention. FIGS. 4A, 4B, and 4C are diagrams illustrating the main manufacturing processes of the method for manufacturing the semiconductor device according to the second embodiment. Specifically, the manufacturing processes illustrated in FIGS. 4A, 4B, and 4C are manufacturing processes for the protective diode 101 illustrated in FIGS. 1A and 1B.

First, in FIG. 4A, an epitaxial substrate 1a obtained by epitaxially growing an n⁺ layer 3a (which will be the n buffer layer 3) and an n⁻ layer 4a (which will be the n drift layer 4) in this order on the front surface of a thick p-type semiconductor base 2a (which will be the p collector layer 2) whose rear surface has not been ground is prepared. The sum of the thicknesses of the n⁺ layer 3a and the n⁻ layer 4a is, for example, about 100 μm and the total thickness of the epitaxial substrate 1a is, for example, about 625 μm. The LOCOS oxide film 5 is selectively formed on the surface of the n⁻ layer 4a forming the epitaxial substrate 1a (the front surface of the epitaxial substrate 1a).

Then, the p well layer 6, the high-concentration p⁺ well layer 6a, and a breakdown voltage structure of the edge termination region 104 in the IGBT are formed on the front surface side of the epitaxial substrate 1a by a general method, using the LOCOS oxide film 5 as a mask. The breakdown voltage structure of the edge termination region 104 is, for example, a guard ring or a field plate which surrounds the active portion of the IGBT. Then, the n⁺ emitter layer 7 is selectively formed in the p well layer 6 and the gate electrode 8 is formed on the surface of a portion of the p well layer 6 which is interposed between the n⁺ emitter layer 7 and the n⁻ layer 4a, with the gate oxide film 8a interposed therebetween.

Then, the polysilicon layer 9 is formed on the LOCOS oxide film 5 (which will be a field oxide film) in the edge termination region 104. Then, the polysilicon layer 9 is patterned to have a sufficient size to form the protective diode 101 by etching. Then, for example, phosphorus (P) ions are implanted into the entire polysilicon layer 9 with a dose of about $2 \times 10^{14}$ cm⁻² to $6 \times 10^{14}$ cm⁻². Then, a heat treatment is performed at a temperature of, for example, 1000° C. or higher to form the n⁻ layer (first-conductivity-type semiconductor layer) 10 with low impurity concentration on the entire surface of the polysilicon layer 9. That is, the entire polysilicon layer 9 becomes the n⁻ layer 10.

When the ion implantation dose for forming the n⁻ layer 10 is less than $2 \times 10^{14}$ cm⁻², the amount of impurities in the n⁻ layer 10 is reduced and the electric field intensity of the entire n⁻ layer 10 increases. As a result, the leakage current lo is likely to increase over time. On the other hand, when the ion implantation dose for forming the n⁻ layer 10 is greater than $6 \times 10^{14}$ cm⁻², the amount of impurities in the n⁻ layer 10 is too large and the spreading of the depletion layer in the n⁻ layer 10 is suppressed. In particular, electric field intensity increases in the pn junction surface 19 between the p⁺ layer 12 and the n⁻ layer 10 and the leakage current is likely to increase over time. Therefore, the ion implantation dose for forming the n⁻ layer 10 may be about $4 \times 10^{14}$ cm⁻².

When the heat treatment temperature after the ion implantation for forming the n⁻ layer 10 is lower than 1000° C., the diffusion depth of phosphorus is insufficient and there is a concern that the impurity concentration of the n⁻ layer 10 will be reduced in the depth direction. Therefore, the heat treatment temperature may be in the range of about 1100° C. to 1200° C. such that phosphorus can be sufficiently diffused. When the heat treatment temperature after the ion implantation for forming the n⁻ layer 10 is higher than 1200° C., a dedicated heat treatment furnace may be required, and the dimensions of each layer formed on the epitaxial substrate 1a may be changed, which is not preferable.

Then, in FIG. 4B, for example, boron ions and arsenic (As) ions are selectively implanted into a portion of the n⁻ layer 10 (first-conductivity-type semiconductor layer) to form separated, different implanted regions including the p⁺ layer 12, the n⁺ contact layer 13 and the n⁺ layer 11 as shown in FIG. 4C, where the boron ions and arsenic (As) ions are implanted with a dose of about $2 \times 10^{15}$ cm$^{-2}$ and a dose of about $5 \times 10^{15}$ cm$^{-2}$, respectively, using a mask (not illustrated). Here, the impurities implanted into the n⁻ layer 10 are diffused by a heat treatment in a reflow furnace which is the subsequent process for forming the BPSG film 14. In this way, the p⁺ layer 12, the n⁺ contact layer 13, and the n⁺ layer 11, which pass through the n⁻ layer 10 in the depth direction, are selectively formed in the n⁻ layer 10 with the p+ layer 12, the n+ contact layer 13 and the n+ layer 11 being separated from each other by the n− layer 10. A portion in which the p⁺ layer 12, the n⁺ contact layer 13, and the n⁺ layer 11 are not formed is the n⁻ layer 10.

For a boron implantation (ion implantation) mask for forming the p⁺ layer 12 and an As implantation (ion implantation) mask for forming the n⁺ contact layer 13 and the n⁺ layer 11, a width on the masks (the distance of a portion interposed between the boron implantation mask and the As implantation mask, that is, the width of a portion which is not implanted with boron and arsenic) may be in the range of about 1.2 μm to 1.8 μm. When the width of the portion is less than 1.2 μm, the width of the n⁻ layer 10 is too small and a desired breakdown voltage is not obtained. On the other hand, when the width of the portion is greater than 1.8 μm, the leakage current lo increases for a large number of recombination centers in the polysilicon layer 9. In addition, the area of the protective diode 101 increases. Therefore, the width of the portion which is not implanted with boron and arsenic, that is, the width of the n⁻ layer 10 may be about 1.5 μm.

The protective diode 101 (bidirectional zener diode) with the structure in which the n⁺ contact layer 13, the n⁻ layer 10, the p⁺ layer 12, the n⁻ layer 10, the n⁺ layer 11, the n⁻ layer 10, the p⁺ layer 12, the n⁻ layer 10, and the n⁺ contact layer 13 are arranged in this order so as to adjacent to each other and are connected in series to each other is completed by the above-mentioned process. The above-mentioned process is an example of the manufacturing process when one basic structure 103 (n⁺/n⁻/p⁺/n⁻ structure) is provided in the protective diode 101. The protective diode 101 with a high breakdown voltage is an aggregate in which a plurality of the basic structures 103 are connected in series to each other.

Then, in FIG. 4C, the BPSG film 14, which is an interlayer insulating film, is formed on the surface of the protective diode 101. Then, contact holes are formed. Then, a metal film is formed on the BPSG film 14 so as to fill the contact holes in the BPSG film 14 and is then patterned. In the patterning of the metal film, the emitter electrode 17 which is connected to the high-concentration p⁺ well layer 6a and the n⁺ emitter layer 7 through the contact holes of the BPSG film 14 is formed. In addition, the wiring line 15 and the gate runner electrode 16 which are connected to the n⁺ contact layers 13 with high impurity concentration provided at both ends of the protective diode 101 through the contact holes of the BPSG film 14 are formed.

The BPSG film 14 is formed by, for example, a heat treatment which is performed in the reflow furnace at a temperature of 1000° C. or lower. Then, the rear surface 1b of the epitaxial substrate 1a is ground to form the epitaxial substrate 1 with a product thickness of, for example, about 100 μm. Then, the collector electrode 18 that comes into contact with the p-type semiconductor base 2a which will be the p collector layer 2 is formed on the ground rear surface 1c of the epitaxial substrate 1a. In this way, the semiconductor device 100 illustrated in FIGS. 1A and 1B is completed.

In order to form the n⁻ layer 10 with low impurity concentration, phosphorus is used and a heat treatment is performed at a temperature of 1000° C. or higher. Therefore, the impurity concentration of the n⁻ layer 10 can be substantially constant in the thickness direction (depth direction) (can be flattened). As a result, the pn junction surface 19 between the p⁺ layer 12 and the n⁻ layer 10 in the protective diode 101 is flattened, the concentration of the electric field on the pn junction is suppressed, and it is possible to manufacture the semiconductor device 100 with high reliability.

As described above, according to the second embodiment, it is possible to obtain the same effect as that in the first embodiment.

Third Embodiment

Figure 9:
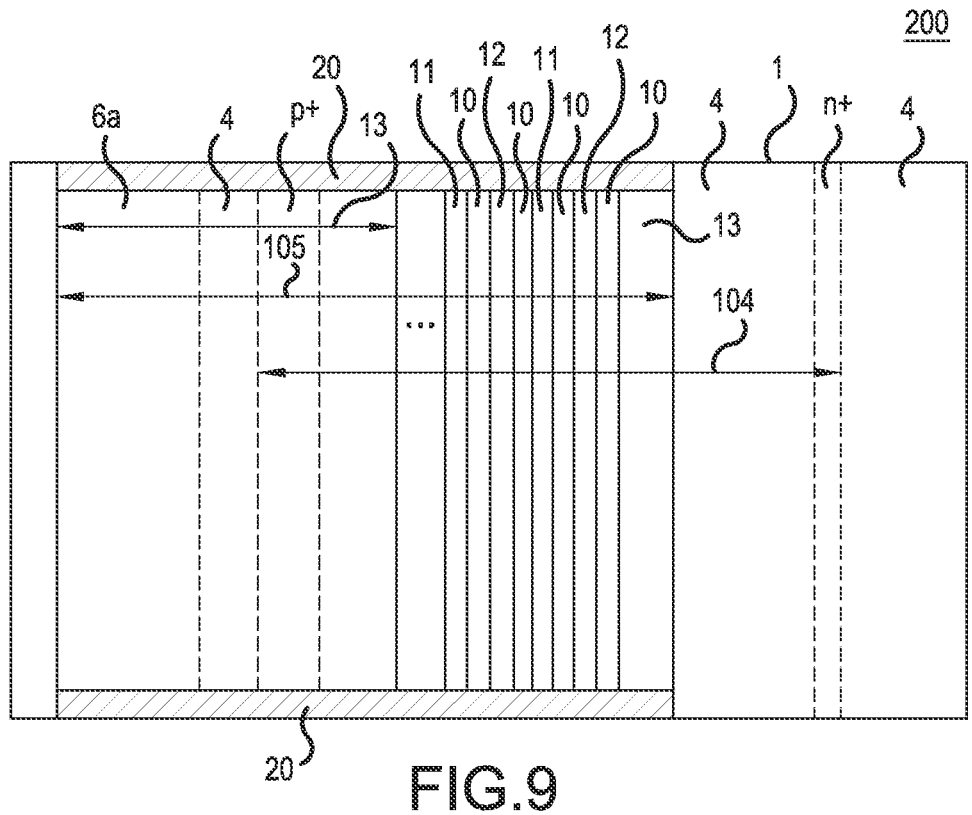
FIG. 9 is a plan view illustrating a main portion of a semiconductor device according to a third embodiment of the invention.

Next, the structure of a semiconductor device according to a third embodiment of the invention will be described. FIG. 9 is a plan view illustrating a main portion of a semiconductor device 200 according to the third embodiment of the invention. The semiconductor device 200 according to the third embodiment differs from the semiconductor device according to the first embodiment in that, in a protective diode 105 which is made of a polysilicon layer 9, high-resistance regions 20 are formed at both ends of a basic structure 103 in a direction perpendicular to the direction in which n⁺/n⁻/p⁺/n⁻ layers are arranged in a line.

The high-resistance region 20 is formed in a substantially linear shape which extends from an n⁺ contact layer 13 which is provided on the inner circumferential side of the protective diode 105 to an n⁺ contact layer 13 which is provided on the outer circumferential side in the direction in which the layers of the protective diode 105 are arranged in a line and terminates the ends of the n⁺/n⁻/p⁺/n⁻ layers of the basic structure 103 (ends in a direction perpendicular to the direction in which the layers are arranged in a line). When the thickness of the polysilicon layer 9 is, for example, about 1 μm, the thickness of the high-resistance region 20 is, for example, about 1 μm and the width of the high-resistance region 20 (the width in the direction perpendicular to the direction in which the layers of the protective diode 105 are arranged in a line (lateral direction)) is, for example, about 10 μm. The length of the high-resistance region 20 (the width in the direction in which the layers of the protective diode 105 are arranged in a line) is equal to the length of the polysilicon layer 9 (the width in the direction in which the layers of the protective diode 105 are arranged in a line) and is, for example, about 300 μm. The width of the protective diode 105 in the lateral direction is, for example, 600 μm.

Next, the resistance value and resistivity of the high-resistance region 20 will be described. The resistance value of the high-resistance region 20 may be, for example, equal to or greater than 1 MΩ and preferably, equal to or greater than 10 MΩ. The resistivity of the high-resistance region 20 may be, for example, equal to or greater than 10 Ωcm and preferably, equal to or greater than 100 Ωcm. For example, when the high-resistance region 20 is an n-type polysilicon layer, the resistivity of the high-resistance region 20 corresponds to, for example, a doping concentration of $4.6 \times 10^{14}$/cm$^3$ or less and preferably a doping concentration of $4.6 \times 10^{14}$/cm$^3$ or less when it is converted into the doping concentration of phosphorus or arsenic.

Figure 10:
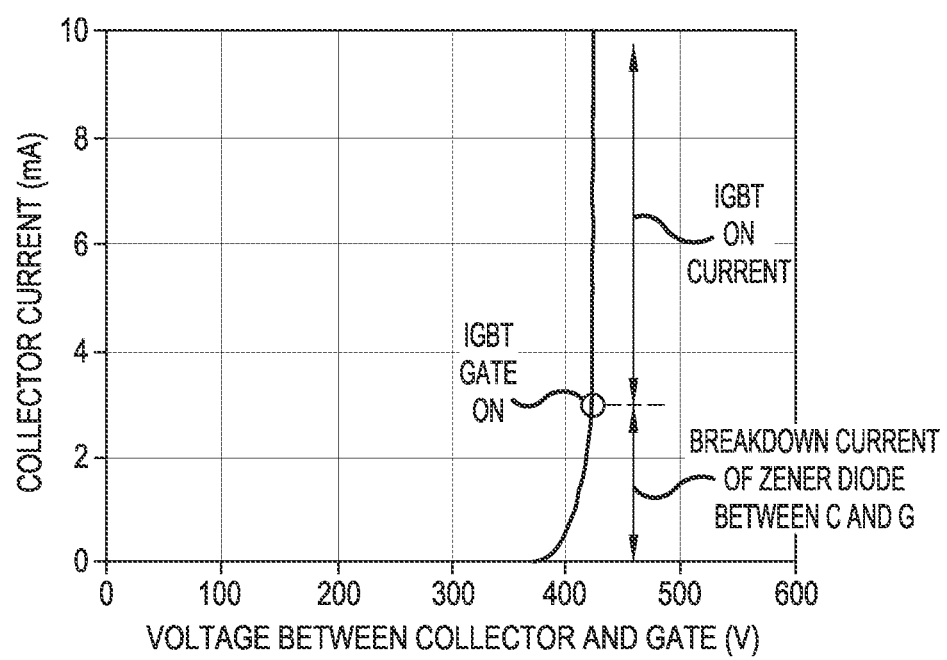
FIG. 10 is a characteristic diagram illustrating the waveform of a collector current with respect to a voltage between the collector and gate of an IGBT of the semiconductor device according to the third embodiment of the invention.

The reason why the high-resistance region 20 is set to the above-mentioned resistance value and resistivity is as follows. FIG. 10 is a characteristic diagram illustrating the waveform of a collector current with respect to a voltage between the collector and gate of an IGBT of the semiconductor device 200 according to the third embodiment of the invention. When the voltage between the collector and gate of the IGBT of the semiconductor device 200 is close to 400 V, breakdown occurs in a pn junction between a $p^+$ layer and an $n^-$ layer of the protective diode (a zener diode between C and G) which is connected between the collector and gate of the IGBT and a breakdown current flows. In the example illustrated in FIG. 10, a collector current of 0 mA to about 3 mA is the breakdown current of the protective diode. When the collector current is greater than 3 mA, a current also flows to the gate electrode of the IGBT, as described in the operation of the internal-combustion engine ignition device illustrated in FIG. 5. Therefore, the potential of the gate electrode of the IGBT increases and is greater than a gate threshold value and the gate of the IGBT is turned on. As a result, the collector current further increases. In the example illustrated in FIG. 10, the on-current of the IGBT is added to a collector current of 3 mA or more.

When the IGBT is turned off (here, the voltage between the collector and the gate increases to about 400 V), the collector current (leakage current) needs to be sufficiently more than the breakdown current of the protective diode. Therefore, when the voltage between the collector and gate of the IGBT is 400 V, the leakage current of the IGBT needs to be sufficiently less than 0.1 mA (=100 μA). In this case, since the high-resistance region 20 is an ohmic (voltage-current characteristics are linear) resistance region, the resistance value of the high-resistance region 20 needs to be equal to or greater than 4 MΩ (=400 V/100 μA) in order to reduce the leakage current to be less than 100 μA when the voltage between the collector and gate of the IGBT is 400 V. That is, the resistance value of the high-resistance region 20 may be equal to or greater than 1 MΩ and preferably equal to or greater than 10 MΩ. Of course, the leakage current which is reduced due to the high-resistance region 20 should be minimized. Therefore, the resistance value of the high-resistance region 20 may be equal to or greater than 100 MΩ or it may be a possible maximum value.

In order to obtain the above-mentioned resistance value of the high-resistance region 20, the high-resistance region 20 has the following resistivity. As described above, for example, the thickness of the high-resistance region 20 is 1 μm, the width of the high-resistance region 20 is 10 μm, and the length of the high-resistance region 20 (the width in the direction in which the layers of the protective diode 105 are arranged in a line) is 300 μm. In addition, two high-resistance regions 20 are arranged in parallel, with the protective diode 105 interposed therebetween. In this case, when the resistance value of the high-resistance region 20 is 1 MΩ, the resistivity of the high-resistance region 20 is appropriately 6.7 [Ωcm] (≈2 [units]×1 [MΩ]×1 [μm]×10 [μm]/300 [μm]). That is, the resistivity of the high-resistance region 20 may be equal to or greater than about 10 Ωcm, preferably equal to or greater than 100 Ωcm, and more preferably equal to or greater than 1 kΩcm. In this case, when the high-resistance region 20 is, for example, a polysilicon layer, it may not be doped with an impurity (undoped). Even when n-type impurities are doped, the doping concentration of the high-resistance region 20 may be equal to or less than $4.6×10^{14}/cm^3$, which is impurity concentration corresponding to 10 Ωcm, preferably equal to or less than $4.6×10^{13}/cm^3$, and more preferably equal to or less than $4.6×10^{12}/cm^3$. In addition, it is presumed that undoped polysilicon has a carrier concentration of $1.45×10^{10}/cm^3$, which is the intrinsic carrier concentration of silicon, at least at 300 K. Therefore, the lower limit of the doping concentration of the n-type impurities in the high-resistance region 20 may be, for example, $1.4×10^{10}/cm^3$. When the lower limit of the doping concentration of the n-type impurities in the high-resistance region 20 is converted into resistivity, it is about 330 kΩcm. Therefore, the upper limit of the resistivity of the high-resistance region 20 may be, for example, about 330 kΩcm.

As such, since the high-resistance regions 20 having sufficiently high resistance are provided at both ends of the protective diode 105 in the direction perpendicular to the direction in which the layers are arranged in a line, it is possible to terminate the ends of the $n^+/n^-/p^+/n^-$ layers of the basic structure 103 (zener diode portion) of the protective diode 105 (the ends in the direction perpendicular to the direction in which the layers are arranged in a line). Therefore, when a high voltage of 100 V or more, for example, 400 V is applied between the collector and gate of the IGBT, the effect of suppressing the concentration of the electric field on the end of the protective diode 105 is obtained. In addition, since the resistance value of the high-resistance region 20 is appropriately controlled in the above-mentioned range, a very small amount of current can flow to the high-resistance region 20. Therefore, the potential distribution of the protective diode 105 becomes a linear distribution which is proportional to the length of the protective diode 105 (the width in the direction in which the layers of the protective diode 105 are arranged in a line) and the electric field can be maintained to be substantially constant. As a result, when the $n^+/n^-/p^+/n^-$ layers of the zener diode portion are formed, an impurity concentration variation is absorbed and it is possible to ensure high and long-term reliability.

In a method for manufacturing the semiconductor device 200 including the high-resistance region 20, a basic process flow is the same as that in the method for manufacturing the semiconductor device according to the second embodiment. When the high-resistance region 20 is an undoped polysilicon layer and each layer of the basic structure 103 is formed by ion implantation, a predetermined position (end) of the polysilicon layer 9 may be protected by a resist. When the high-resistance region 20 is a doped polysilicon layer, the following processes are added. In a process for forming the protective diode 105, a resist is coated on the surface of the polysilicon layer 9 and only a portion of the polysilicon layer 9 in which the high-resistance region 20 is formed is opened to form a resist mask. Then, for example, phosphorus ions are selectively implanted into the polysilicon layer 9, using the resist mask as a mask. In this case, when the thickness of the polysilicon layer 9 is, for example, 1 μm and the doping concentration of the high-resistance region 20 is, for example, equal to or less than $4.6×10^{14}/cm^3$, the ion implantation dose may be equal to or less than $4.6×10^{10}/cm^2$.

As described above, according to the third embodiment, it is possible to obtain the same effect as that in the first and second embodiments.

Fourth Embodiment

Figure 11A:
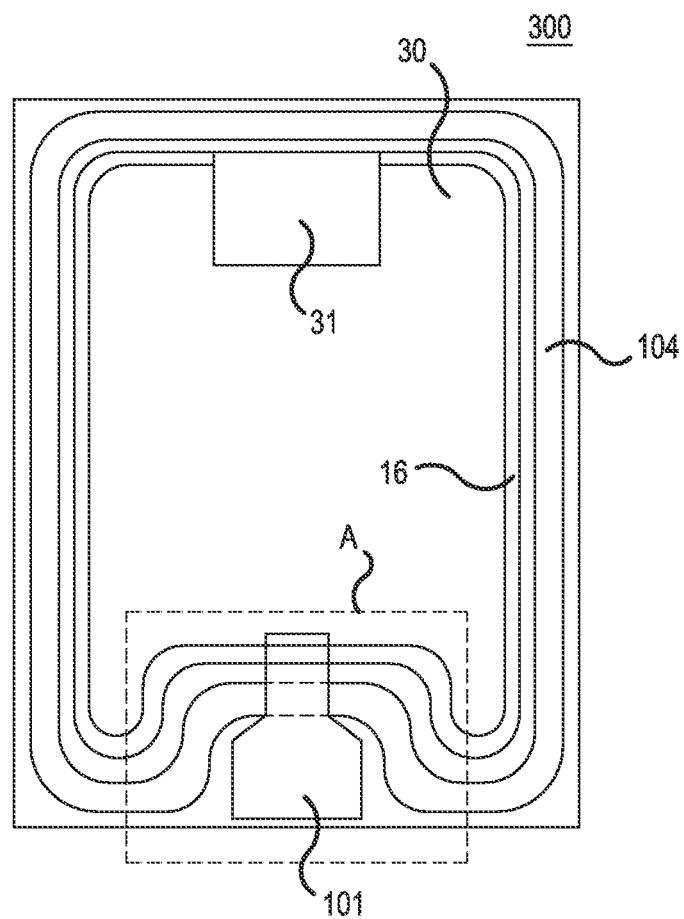
FIGS. 11A and 11B are plan views illustrating a main portion of a semiconductor device according to a fourth embodiment of the invention.
Figure 11B:
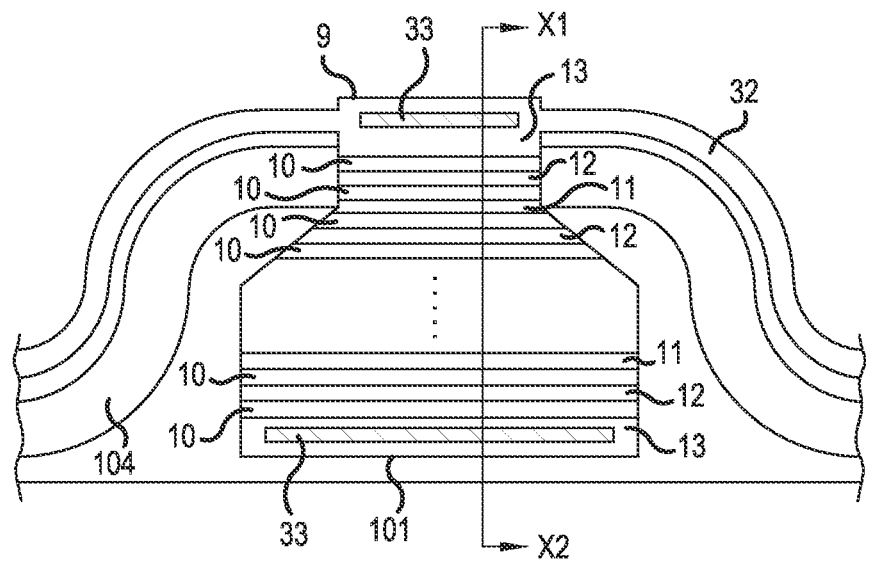

Next, the structure of a semiconductor device according to a fourth embodiment of the invention will be described. FIGS. 11A and 11B are views illustrating a main portion of a semiconductor device 300 according to the fourth embodiment of the invention, where FIG. 11A is a plan view illustrating the entire semiconductor device 300, and FIG. 11B is an enlarged plan view illustrating a region A illustrated in FIG. 11A. The semiconductor device 300 according to the fourth embodiment differs from the semiconductor device according to the first embodiment in that a portion of the constant voltage side (inner circumferential side) of an edge termination region 104 is formed below (on the epitaxial substrate side of) a protective diode 101.

In FIG. 11A, the semiconductor device 300 includes an active portion 30, which is a region in which a main current of an IGBT flows, and a gate pad 31 for connecting a gate electrode to an external circuit. A gate runner electrode 16 which connects the gate pad 31 and a gate electrode of each unit cell of the active portion 30 is formed around the active portion 30 so as to surround the active portion. The gate pad 31 is provided in the vicinity of a boundary with the edge termination region 104 in the active portion 30. A gate runner 32 (not illustrated in FIG. 11A) which is made of polysilicon is formed below (on the epitaxial substrate side of) the gate runner electrode 16. A protective diode 101 is formed so as to be opposite to the gate pad 31, with the center of the semiconductor device 300 interposed therebetween. The gate runner electrode 16, the gate runner 32, and the edge termination region 104 are curved in a convex shape toward the active portion 30 so as to pass below the inner circumferential side of the protective diode 101 and are retreated from a scribe surface to the active portion 30.

FIG. 11B is an enlarged plan view illustrating the region A surrounded by a dashed line in FIG. 11A. In FIG. 11B, the gate runner electrode 16 is not illustrated and the gate runner 32 which is provided below the gate runner electrode 16 is illustrated. The protective diode 101 is formed by the same polysilicon layer as the gate runner 32. The protective diode 101 is connected to the gate runner electrode 16 through an opening portion 33 of a BPSG film 14 (not illustrated) on the inner circumferential side which overlaps the gate runner 32. In addition, the opening portion 33 of the BPSG film 14 may extend to the gate runner 32. An n$^+$ contact layer 13 is formed below a portion of the BPSG film 14 in which the opening portion 33 is formed. The n$^+$ contact layer 13 has the potential of the gate electrode.

A plurality of basic structures 103 are formed in a direction from the inner circumferential side to the outer circumferential side. An n$^-$ layer 10, a p$^+$ layer 12, the n$^-$ layer 10, and an n$^+$ layer 11 of each basic structure 103 are sequentially formed in the direction from the inner circumferential side to the outer circumferential side so as to be adjacent to the n$^+$ contact layer 13. In FIG. 11B, black circles indicate that the basic structures 103 are repeatedly formed. For example, a guard ring which forms a breakdown voltage structure of the edge termination region 104 is formed below the inner circumferential side of the protective diode 101. In addition, on the outer circumferential side of the edge termination region 104, the length of the n$^-$ layer 10, the p$^+$ layer 12, the n$^-$ layer 10, and the n$^+$ layer 11 (the width in a direction perpendicular to the direction in which the layers are arranged in a line) increases to reduce resistance when the breakdown current flows.

On the outer circumferential side of the protective diode 101, the n$^-$ layer 10, the p$^+$ layer 12, the n$^-$ layer 10, and the n$^+$ layer 11 of the basic structure 103 are sequentially arranged in the direction from the inner circumferential side to the outer circumferential side and the n$^+$ contact layer 13 is formed adjacent to the n$^+$ layer 11 which is provided on the outermost circumferential side. The n$^+$ contact layer 13 is connected to a wiring line 15 (not illustrated) through the opening portion 33 of the BPSG film 14.

Figure 12A:
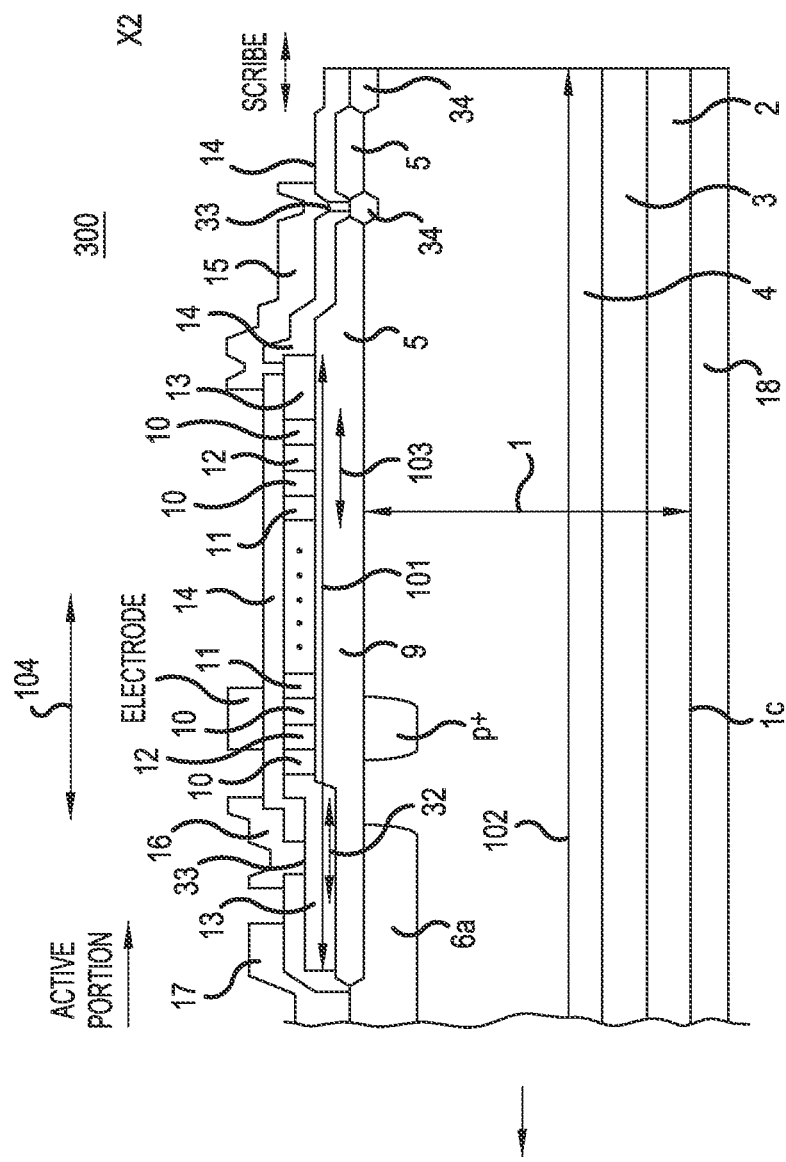
FIGS. 12A and 12B are cross-sectional views illustrating the structure of a semiconductor device according to a fourth embodiment of the invention.
Figure 12B:
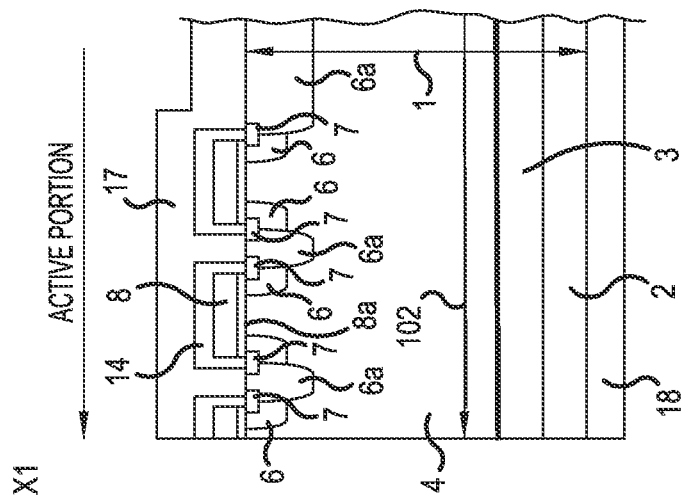

In addition, the semiconductor device 300 according to the fourth embodiment of the invention will be described with reference to a cross-sectional view. FIGS. 12A and 12B illustrate the cross-sectional structure of the semiconductor device 300 taken along the cutting line X1-X2 of FIG. 11B. The active portion of the IGBT continues from FIG. 12A to FIG. 12B. The protective diode 101 which is the polysilicon layer 9 is formed on a thick LOCOS oxide film 5. The inner circumferential end (active-portion-side end) of the protective diode is the n$^+$ contact layer 13 and the n$^+$ contact layer 13 which is provided on the inner circumferential side is connected to the gate runner electrode 16 through the opening portion 33 of the BPSG film 14. The n$^-$ layer 10, the p$^+$ layer 12, the n$^-$ layer 10, and the n$^+$ layer 11 of each of a plurality of basic structures 103 are formed in the polysilicon layer 9 of the protective diode 101 from the n$^+$ contact layer 13 which is provided on the inner circumferential side to the outer circumferential side. In FIG. 12A, black points indicate that the plurality of basic structures 103 are formed in series.

The edge termination region 104 is formed below the inner circumferential side of the protective diode 101 on the outer circumferential side of the gate runner electrode 16. Specifically, a p$^+$ layer which will be a guard ring forming the edge termination region 104 is formed in a surface layer of the n drift layer 4 (a surface layer of the front surface of the epitaxial substrate 1). In addition, an electrode which will be a field plate is formed on the p$^+$ layer which will be the guard ring, with the LOCOS oxide film 5, the protective diode 101, and the BPSG film 14 interposed therebetween. As such, since the guard ring forming the breakdown voltage structure of the edge termination region 104 is formed below an inner circumferential portion of the protective diode 101, the protective diode 101 can function as a pseudo-field plate. Therefore, it is possible to reduce the electric field intensity of the edge termination region 104. Since the electrode which will be the field plate is formed, the electric field intensity is further reduced.

The outer circumferential end of the protective diode 101 is the n$^+$ contact layer 13 and is terminated on the LOCOS oxide film 5. The n$^+$ contact layer 13 on the outer circumferential side is connected to the wiring line 15 through the opening portion 33 of the BPSG film 14. The wiring line 15 is connected to an n$^+$ scribe layer 34. Therefore, the wiring line 15 and the n$^+$ contact layer 13 have the potential of the collector electrode of the IGBT.

As described above, according to the fourth embodiment, it is possible to obtain the same effect as that in the first and second embodiments. In addition, according to the fourth embodiment of the invention, since the guard ring forming the breakdown voltage structure of the edge termination region is provided below the inner circumferential portion of the protective diode, it is possible to reduce the electric field of the edge termination region and to ensure long-term reliability.

The invention is not limited to the above-described embodiments, but various modifications and changes of the invention can be made without departing from the scope and spirit of the invention. In each embodiment, the first conductivity type is an n type and the second conductivity type is a p type. However, in the invention, the first conductivity type may be a p type and the second conductivity type may be an n type. In this case, the same effect as described above is obtained.

As described above, the semiconductor device and the semiconductor device manufacturing method according to embodiments of the invention are useful for a semiconductor device in which a surge protective diode that protects a power semiconductor element from a surge voltage applied from the outside or a surge voltage generated from an element during switching is formed on the same semiconductor substrate as the power semiconductor element.

The invention claimed is:

1. A method for manufacturing the semiconductor device, comprising:

forming a polysilicon layer on an insulating film;

implanting phosphorus ions into the polysilicon layer and performing a first heat treatment to form a first-conductivity-type semiconductor layer; and selectively implanting boron ions and arsenic ions into regions of the first-conductivity-type semiconductor layer so as to form separated, different implanted regions and performing a second heat treatment of the separated, different implanted regions to form a plurality of third semiconductor regions and a plurality of first semiconductor regions, which reach the insulating film through the first-conductivity-type semiconductor layer in a depth direction and have a higher impurity concentration than the first-conductivity-type semiconductor layer, the plurality of third semiconductor regions and the plurality of first semiconductor regions being separated from each other by regions of the first-conductivity-type semiconductor layer that are not implanted with the boron ions and the arsenic ions, wherein an end of the polysilicon layer comprises a first semiconductor region among the plurality of first semiconductor regions.

2. The method for manufacturing the semiconductor device according to claim 1, wherein the first-conductivity-type semiconductor layer has a substantially constant impurity concentration in a thickness direction.

3. The method for manufacturing the semiconductor device according to claim 1, wherein selectively implanting boron ions and arsenic ions comprises:

implanting the boron ions, using a first mask formed on the first-conductivity-type semiconductor layer, to form the plurality of third semiconductor regions; and implanting the arsenic ions, using a second mask formed on the first-conductivity-type semiconductor layer, to form the plurality of first semiconductor regions, and the width of a portion of the first-conductivity-type semiconductor layer covered by both the first mask and the second mask is equal to or greater than 1.2 μm and equal to or less than 1.8 μm.

4. The method for manufacturing the semiconductor device according to claim 1, wherein, in the implantation of the phosphorus ions, the phosphorus ions are implanted with a dose that is equal to or greater than $2\times10^{14}$ cm$^{-2}$ and equal to or less than $6\times10^{14}$ cm$^{-2}$.

5. The method for manufacturing the semiconductor device according to claim 1, wherein the first heat treatment is performed at a temperature in a range of 1000° C. to 1200° C.

* * * * *